United States Patent
Lee et al.

(10) Patent No.: US 9,911,761 B2
(45) Date of Patent: Mar. 6, 2018

(54) THIN-FILM TRANSISTOR ARRAY SUBSTRATE AND ORGANIC LIGHT-EMITTING DIODE DISPLAY INCLUDING THE SAME

(71) Applicant: Samsung Display Co., Ltd., Yongin, Gyeonggi-Do (KR)

(72) Inventors: Minjung Lee, Yongin (KR); Dohyun Kwon, Yongin (KR); Iljeong Lee, Yongin (KR); Jungkyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/814,341

(22) Filed: Jul. 30, 2015

(65) Prior Publication Data

US 2016/0181339 A1 Jun. 23, 2016

(30) Foreign Application Priority Data

Dec. 19, 2014 (KR) ........................ 10-2014-0184960

(51) Int. Cl.
  *H01L 29/04* (2006.01)
  *H01L 27/12* (2006.01)
  *H01L 27/32* (2006.01)

(52) U.S. Cl.
  CPC ...... *H01L 27/1248* (2013.01); *H01L 27/1255* (2013.01); *H01L 27/3262* (2013.01); *H01L 27/3265* (2013.01)

(58) Field of Classification Search
  None
  See application file for complete search history.

(56) References Cited

U.S. PATENT DOCUMENTS

| 2007/0181881 A1 | 8/2007 | Koh et al. |
| 2008/0024479 A1 | 1/2008 | Jung et al. |
| 2014/0034923 A1 | 2/2014 | Kim et al. |
| 2014/0175393 A1 | 6/2014 | Beak et al. |

(Continued)

FOREIGN PATENT DOCUMENTS

| JP | 2010-040999 A | 2/2010 |
| KR | 10-2007-0080206 A | 8/2007 |
| KR | 10-2008-0011829 A | 2/2008 |

(Continued)

*Primary Examiner* — Jack Chen
(74) *Attorney, Agent, or Firm* — Knobbe, Martens, Olson & Bear, LLP

(57) ABSTRACT

A thin-film transistor (TFT) array substrate and organic light-emitting diode (OLED) display are disclosed. In one aspect, the TFT array substrate includes a driving TFT including a driving gate electrode, a switching TFT including a switching gate electrode and spaced apart from the driving TFT, and a storage capacitor including a first electrode electrically connected to the driving gate electrode and a second electrode formed over and insulated from the first electrode. The TFT array substrate also includes a capacitor insulating film formed between the first and second electrodes and an interlayer insulating film covering at least part of the driving TFT, at least part of the switching TFTs, and the capacitor insulating film, wherein the switching gate electrode and the second electrode are formed of the same material.

20 Claims, 8 Drawing Sheets

(56) References Cited

U.S. PATENT DOCUMENTS

2015/0255523 A1* 9/2015 Her .................. H01L 27/3262
　　　　　　　　　　　　　　　　　　　345/76
2016/0035805 A1* 2/2016 Kim .................. H01L 27/3262
　　　　　　　　　　　　　　　　　　　345/76

FOREIGN PATENT DOCUMENTS

| KR | 10-2014-0018623 A | 2/2014 |
| KR | 10-2014-0083852 A | 7/2014 |

* cited by examiner

THIN-FILM TRANSISTOR ARRAY SUBSTRATE AND ORGANIC LIGHT-EMITTING DIODE DISPLAY INCLUDING THE SAME

INCORPORATION BY REFERENCE TO ANY PRIORITY APPLICATIONS

This application claims the benefit of Korean Patent Application No. 10-2014-0184960, filed on Dec. 19, 2014, in the Korean Intellectual Property Office, the disclosure of which is incorporated herein in its entirety by reference.

BACKGROUND

Field

The described technology generally relates to a thin-film transistor (TFT) array substrate and an organic light-emitting diode (OLED) display including the same.

Description of the Related Technology

An OLED display includes a matrix of OLEDs each including a hole injection electrode, an electron injection electrode, and an organic emission layer formed therebetween. Excitons are generated as holes injected from the hole injection electrode and electrons injected from the electron injection electrode combine in the organic emission layer change from an excited state to a ground state to emit light.

Since the display does not use a separate light source, the OLED display can be driven at a low voltage, light-weight, and thin Furthermore, the OLED technology is considered to be a next generation display due to its favorable characteristics, such as wide viewing angles, high contrast, and quick response speeds.

SUMMARY

One inventive aspect relates to a thin-film transistor (TFT) array substrate and an OLED display including the same.

Another aspect is a thin-film transistor (TFT) array substrate that includes: a driving TFT and a switching TFT formed on a substrate; a storage capacitor including a first electrode connected to a driving gate electrode of the driving TFT, and a second electrode formed on the first electrode and insulated from the first electrode; a capacitor insulating film formed between the first electrode and the second electrode of the storage capacitor; and an interlayer insulating film formed on an entire surface of the substrate to cover the second electrode, wherein a switching gate electrode of the switching TFT is simultaneously formed with the second electrode.

The capacitor insulating film can be partially formed inside a region of the driving TFT.

A dielectric constant of the capacitor insulating film can be higher than that of the interlayer insulating film.

The capacitor insulating film can be formed of an inorganic material and the interlayer insulating film can be formed of an organic material.

The driving TFT and the storage capacitor can at least partially overlap each other.

The driving gate electrode and the first electrode can be integrally formed on a same layer.

Another aspect is a thin-film transistor (TFT) array substrate that includes: a driving TFT and a switching TFT formed on a substrate; a storage capacitor including a first electrode connected to a driving gate electrode of the driving TFT, and a second electrode formed on the first electrode and insulated from the first electrode; a capacitor insulating film formed between the first electrode and the second electrode; and an interlayer insulating film formed on an entire surface of the substrate to cover the second electrode, wherein the capacitor insulating film is partially formed inside a region of the driving TFT.

A switching gate electrode of the switching TFT can be simultaneously formed with the second electrode.

A dielectric constant of the capacitor insulating film can be higher than that of the interlayer insulating film.

The capacitor insulating film can be formed of an inorganic material and the interlayer insulating film can be formed of an organic material.

The driving TFT and the storage capacitor can at least partially overlap each other.

Another aspect is a thin-film transistor (TFT) array substrate that includes: a driving TFT and a switching TFT formed on a substrate; a storage capacitor including a first electrode connected to a driving gate electrode of the driving TFT, and a second electrode formed on the first electrode and insulated from the first electrode; a capacitor insulating film formed between the first electrode and the second electrode; and an interlayer insulating film formed on an entire surface of the substrate to cover the second electrode, wherein the capacitor insulating film is partially formed inside a region of the driving TFT, and the second electrode is connected to a switching gate electrode of the switching TFT.

Another aspect is an OLED display that includes a display area that includes a plurality of pixels, and a non-display area formed around the display area, wherein each of the plurality of pixels includes: a driving thin-film transistor (TFT) and a switching TFT formed on a substrate; a storage capacitor including a first electrode connected to a driving gate electrode of the driving TFT, and a second electrode formed on the first electrode and insulated from the first electrode; a capacitor insulating film formed between the first electrode and the second electrode; and an interlayer insulating film formed on an entire surface of the substrate to cover the second electrode, wherein the capacitor insulating film is partially formed inside a region of the driving TFT.

The second electrode can be connected to a switching gate electrode of the switching TFT.

A dielectric constant of the capacitor insulating film can be higher than that of the interlayer insulating film.

The driving TFT and the storage capacitor can at least partially overlap each other.

Another aspect is a thin-film transistor (TFT) array substrate comprising a driving TFT including a driving gate electrode, a switching TFT including a switching gate electrode and spaced apart from the driving TFT, and a storage capacitor comprising a first electrode electrically connected to the driving gate electrode and a second electrode fanned over and insulated from the first electrode. The TFT array substrate also comprises a capacitor insulating film formed between the first and second electrodes and an interlayer insulating film covering i) at least part of the driving TFT, ii) at least part of the switching TFTs, and iii) the capacitor insulating film, wherein the switching gate electrode and the second electrode are formed of the same material.

The above TFT array substrate further comprises a gate insulating film formed between the first electrode and a driving semiconductor layer of the driving TFT, wherein the capacitor insulating film is formed over the driving TFT, and wherein the capacitor insulating film and the gate insulating film surround the first electrode.

In the above TFT array substrate, the capacitor insulating film has a dielectric constant greater than that of the interlayer insulating film.

In the above TFT array substrate, the capacitor insulating film is formed of an inorganic material, wherein the interlayer insulating film is formed of an organic material.

In the above TFT array substrate, the driving TFT and the storage capacitor at least partially overlap each other.

In the above TFT array substrate, the driving gate electrode and the first electrode are integrally formed over the same layer.

In the above TFT array substrate, the second electrode has a bottom side formed higher than a bottom side of the switching gate electrode.

In the above TFT array substrate, the width of the second electrode is substantially the same as the width of the driving gate electrode.

In the above TFT array substrate, the capacitor insulating film is formed only in a region of the driving TFT.

In the above TFT array substrate, the capacitor insulating film covers top and side portions of the driving electrode.

Another aspect is a thin-film transistor (TFT) array substrate comprising a driving TFT including a driving gate electrode, a switching TFT spaced apart from the driving TFT, and a storage capacitor comprising a first electrode electrically connected to the driving gate electrode and a second electrode formed over and insulated from the first electrode. The TFT array substrate further comprises a capacitor insulating film formed between the first and second electrodes and formed only in a region of the driving TFT and an interlayer insulating film covering i) at least part of the driving TFT, ii) at least part of the switching TFTs, and iii) the capacitor insulating film.

In the above TFT array substrate, the switching TFT includes a switching gate electrode formed of the same material as the second electrode.

In the above TFT array substrate, the driving TFT and the storage capacitor at least partially overlap each other.

The above TFT array substrate further comprises a gate insulating film formed between the first electrode and a driving semiconductor layer of the driving TFT, wherein the capacitor insulating film and the gate insulating film surround the first electrode.

Another aspect is a thin-film transistor (TFT) array substrate comprising a driving TFT, a switching TFT including a switching gate electrode and spaced apart from the driving TFT, and a storage capacitor comprising i) a first electrode configured to function as a gate electrode of the driving TFT and ii) a second electrode formed over and insulated from the first electrode. The TFT array substrate further comprises a capacitor insulating film formed between the first and second electrodes and an interlayer insulating film covering i) at least part of the driving TFT, ii) at least part of the switching TFTs, and iii) the capacitor insulating film, wherein the capacitor insulating film is formed only in a region of the driving TFT, and wherein the second electrode is electrically connected to the switching gate electrode.

In the above TFT array substrate, the capacitor insulating film covers top and side portions of the driving electrode.

Another aspect is an organic light-emitting diode (OLED) display comprising a display area comprising a plurality of pixels and a non-display area surrounding the display area. Each of the pixels comprises a driving thin-film transistor (TFT) including a driving gate electrode, a switching TFT spaced apart from the driving TFT, and a storage capacitor comprising a first electrode electrically connected to the driving gate electrode and a second electrode formed over and insulated from the first electrode. The OLED display also comprises a capacitor insulating film formed between the first and second electrodes and formed only in a region of the driving TFT and an interlayer insulating film covering i) at least part of the driving TFT, ii) at least part of the switching TFTs, and iii) the capacitor insulating film.

In the above OLED display, the second electrode has a bottom side formed higher than a bottom side of the switching gate electrode.

In the above OLED display, the capacitor insulating film is formed only in a region of the driving TFT.

In the above OLED display, the capacitor insulating film covers top and side portions of the driving electrode.

DETAILED DESCRIPTION OF CERTAIN INVENTIVE EMBODIMENTS

Figure 1:
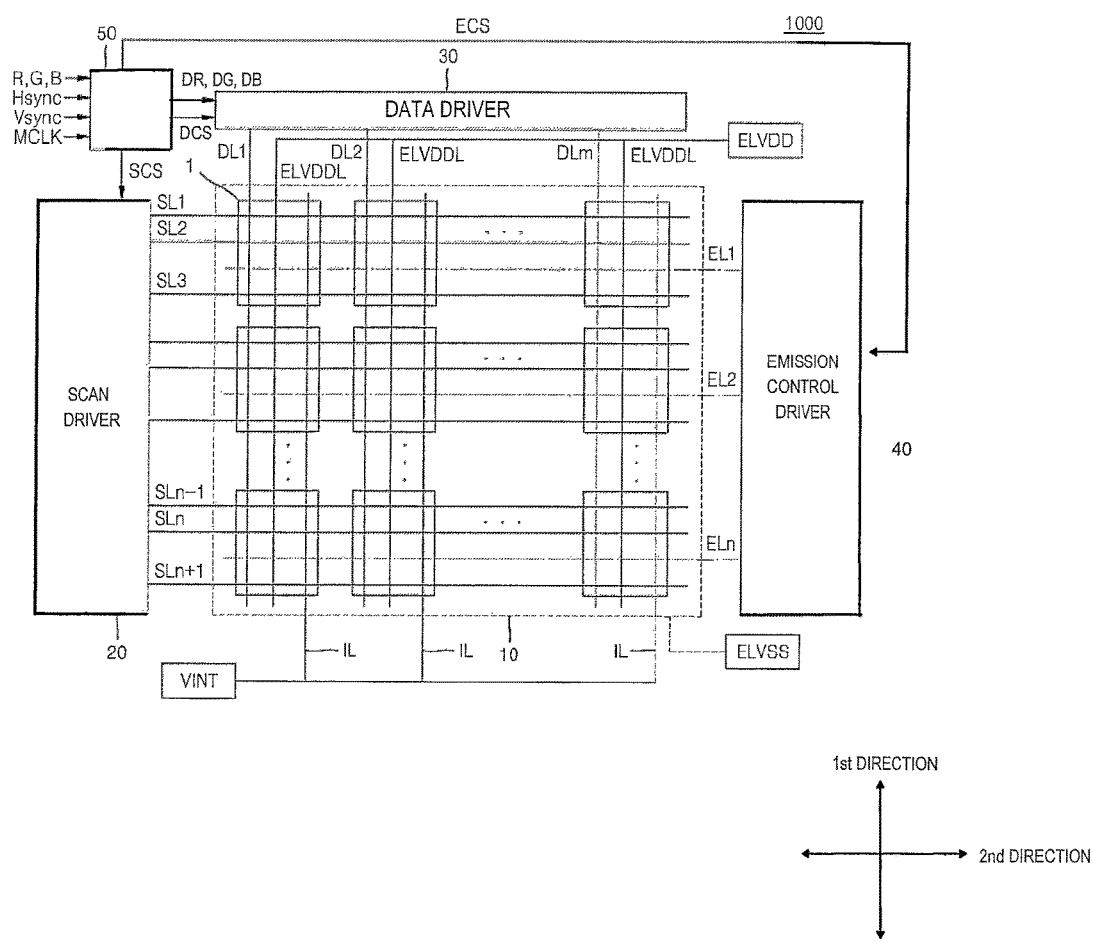
FIG. 1 is a block diagram of an OLED display according to an exemplary embodiment.

Reference will now be made in detail to embodiments, examples of which are illustrated in the accompanying drawings. In this regard, the present embodiments can have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

As used herein, the term "and/or" includes any and all combinations of one or more of the associated listed items. Expressions such as "at least one of", when preceding a list of elements, modify the entire list of elements and do not modify the individual elements of the list.

It will be understood that although the terms "first", "second", etc. can be used herein to describe various components, these components should not be limited by these terms. These components are only used to distinguish one component from another.

As used herein, the singular forms "a," "an" and "the" are intended to include the plural fob's as well, unless the context clearly indicates otherwise.

It will be further understood that the terms "include" and/or "comprise" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

When a certain embodiment can be implemented differently, a specific process order can be performed differently from the described order. For example, two consecutively described processes can be performed substantially at the same time or performed in an order opposite to the described order. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a block diagram of an OLED display 1000 according to an exemplary embodiment.

The OLED display 1000 includes a display unit 10 including a plurality of pixels 1, a scan driving unit or scan driver 20, a data driving unit or data driver 30, an emission control driving unit or emission control driver 40, and a control unit or controller 50.

The display unit 10 includes the pixels 1 that are arranged approximately in a matrix shape by being located at intersections of a plurality of scan lines SL1 through SLn+1, a plurality of data lines DL1 through DLm, and a plurality of emission control lines EL1 through ELn. The scan lines SL1 through SLn+1 and the emission control lines EL1 through ELn extend in a row direction, i.e., a second direction, and the data lines DL1 through DLm and a driving voltage line ELVDDL extend in a column line, i.e., a first direction. A value of n in the scan lines SL1 through SLn+1 and that in the emission control lines EL1 through ELn can be different from each other in one pixel line.

The pixel 1 can be connected to three scan lines from among the scan lines SL1 through SLn+1 transmitted to the display unit 10. The scan driving unit 20 generates and transmits three scan signals to the pixel 1 through the scan lines SL1 through SLn+1. For example, the scan driving unit 20 sequentially supplies the scan signals to first scan lines SL2 through SLn, second scan lines SL1 through SLn−1, or third scan lines SL3 through SLn+1.

An initialization voltage line IL can receive an initialization voltage VINT of the display unit 10 from an external power supply source.

Also, the pixel 1 is connected to one of the data lines DL1 through DLm connected to the display unit 10, and one of the emission control lines EL1 through ELn connected to the display unit 10.

The data driving unit 30 transmits a data signal to the pixel 1 through the data lines DL1 through DLm. The data signal is supplied to the pixel 1 selected by the scan signal whenever the scan signal is supplied to the first scan lines SL2 through SLn.

The emission control driving unit 40 can generate and transmit an emission control signal to the pixel 1 through the emission control lines EL1 through ELn. The emission control signal controls an emission time of the pixel 1. The emission control driving unit 40 can be omitted based on an internal structure of the pixel 1.

The control unit 50 changes a plurality of external image signals R, G, and B to a plurality of image data signals DR, DG, and DB, and transmits the image data signals DR, DG, and DB to the data driving unit 30. Also, upon receiving a vertical synchronization signal Vsync, a horizontal synchronization signal Hsync, and a clock signal MCLK, the control unit 50 can generate and transmit control signals for controlling the scan driving unit 20, the data driving unit 30, and the emission control driving unit 40 respectively thereto. For example, the control unit 50 generates and transmits a scan driving control signal SCS to the scan driving unit 20, a data driving control signal DCS to the data driving unit 30, and, an emission driving control signal ECS to the emission control driving unit 40.

Each of the pixels 1 receives a first power voltage ELVDD and a second power voltage ELVSS from external sources. The first power voltage ELVDD can be a certain high level voltage and the second power voltage ELVSS can be a voltage lower than the first power voltage ELVDD or a ground voltage. The first power voltage ELVDD is supplied to the pixel 1 through the driving voltage line ELVDDL.

Each of the pixels 1 can emit light having certain luminance by a driving current supplied to an emission device according to a data signal transmitted through the data lines DL1 through DLm.

Figure 2:
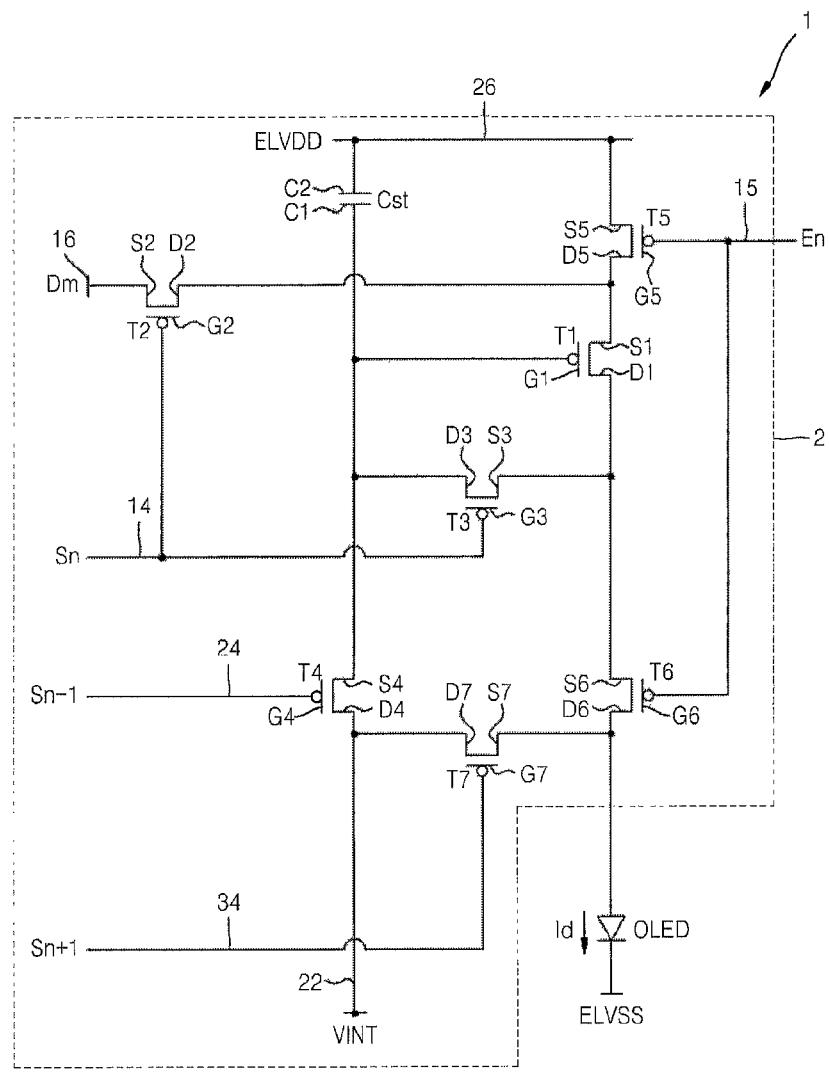
FIG. 2 is an equivalent circuit diagram of one pixel of an OLED display, according to an exemplary embodiment.

FIG. 2 is an equivalent circuit diagram of one pixel 1 of the OLED display 1000, according to an exemplary embodiment.

The pixel 1 of the OLED display 1000 includes a pixel circuit 2 including a plurality of thin-film transistors (TFTs) and at least one storage capacitor Cst. Also, the pixel 1 can include an OLED that can emit light by receiving a driving current through the pixel circuit 2.

The TFTs include a driving TFT T1, a data transmission TFT T2, a compensation TFT T3, a first initialization TFT T4, a first emission control TFT T5, a second emission control TFT T6, and a second initialization TFT T7.

The pixel 1 includes a first scan line 14 transmitting a first scan signal Sn to the data transmission TFT T2 and the compensation TFT T3, a second scan line 24 transmitting a second scan signal Sn−1 to the first initialization TFT T4, and a third scan line 34 transmitting a third scan signal Sn+1 to the second initialization TFT T7. The pixel 1 can also include an emission control line 15 that transmits an emission control signal En to the first and second emission control TFTs T5 and T6, a data line 16 transmitting a data signal Dm, a driving voltage line 26 transmitting the first power voltage ELVDD, and an initialization voltage line 22 transmitting the initialization voltage VINT for initializing the driving TFT T1.

A driving gate electrode G1 of the driving TFT T1 is connected to a first electrode C1 of the storage capacitor Cst. A driving source electrode S1 of the driving TFT T1 is connected to the driving voltage line 26 through the first emission control TFT T5. A driving drain electrode D1 of the driving TFT T1 is electrically connected to a pixel electrode (an anode) of the OLED through the second emission control TFT T6. The driving TFT T1 can supply a driving current Id to the OLED by receiving the data signal Dm according to a switching operation of the data transmission TFT T2.

A data transmission gate electrode G2 of the data transmission TFT T2 is connected to the first scan line 14. A data transmission source electrode S2 of the data transmission TFT T2 is connected to the data line 16. A data transmission drain electrode D2 of the data transmission TFT T2 is connected to the driving source electrode S2 while being connected to the driving voltage line 26 through the first emission control TFT T5. The data transmission TFT T2 can be turned on according to the first scan line Sn received through the first scan line 14 to perform a switching operation of transmitting the data signal Dm transmitted to the data line 16 to the driving source electrode S1.

A compensation gate electrode G3 of the compensation TFT T3 is connected to the first scan line 14. A compensation source electrode S3 of the compensation TFT T3 is connected to the driving drain electrode D1 while being connected to the anode of the OLED through the second emission control TFT T6. A compensation drain electrode D3 of the compensation TFT T3 is connected to the first electrode C1, a first initialization source electrode S4 of the first initialization TFT T4, and the driving gate electrode G1. The compensation TFT T3 can be turned on according to the first scan signal Sn received through the first scan line 14 to diode-connect the driving TFT T1 by connecting the driving gate electrode G1 and the driving drain electrode D1 to each other.

A first initialization gate electrode G4 of the first initialization TFT T4 is connected to the second scan line 24. A first initialization drain electrode D4 of the first initialization TFT T4 is connected to the initialization voltage line 22. The first initialization source electrode S4 is connected to the first electrode C1, the compensation drain electrode D3, and the driving gate electrode G1. The first initialization TFT T4 can be turned on according to the second scan signal Sn−1 received through the second scan line 24 to perform an initialization operation of initializing a voltage of the driving gate electrode G1 by transmitting the initialization voltage VINT to the driving gate electrode G1.

A first emission control gate electrode G5 of the first emission control TFT T5 is connected to the emission control line 15. A first emission control source electrode S5 of the first emission control TFT T5 is connected to the driving voltage line 26. A first emission control drain electrode D5 of the first emission control TFT T5 is connected to the driving source electrode Si and the data transmission drain electrode D1.

A second emission control gate electrode G6 of the second emission control TFT T6 is connected to the emission control line 15. A second emission control source electrode S6 of the second emission control TFT T6 is connected to the driving drain electrode D1 and the compensation source electrode S3. A second emission control drain electrode D6 of the second emission control TFT T6 is electrically connected to the anode of the OLED. The first and second emission control TFTs T5 and T6 can be substantially simultaneously or concurrently turned on according to the emission control signal En received through the emission control line 15 such that the first power voltage ELVDD is transmitted to the OLED and the driving current Id flows through the OLED.

A second initialization gate electrode G7 of the second initialization TFT T7 is connected to the third scan line 34. A second initialization source electrode S7 of the second initialization TFT T7 is connected to the anode of the OLED. A second initialization drain electrode D7 of the second initialization TFT T7 is connected to the initialization voltage line 22. The second initialization TFT T7 can be turned on according to the third scan signal Sn+1 received through the third scan line 34 to initialize the anode of the OLED.

A second electrode C2 of the storage capacitor Cst is connected to the driving voltage line 26. The first electrode C1 is connected to the driving gate electrode G1, the compensation drain electrode D3, and the first initialization source electrode S4.

A cathode of the OLED is connected to the second power voltage ELVSS. The OLED can display an image by emitting light upon receiving the driving current Id from the driving TFT T1.

Figure 3:
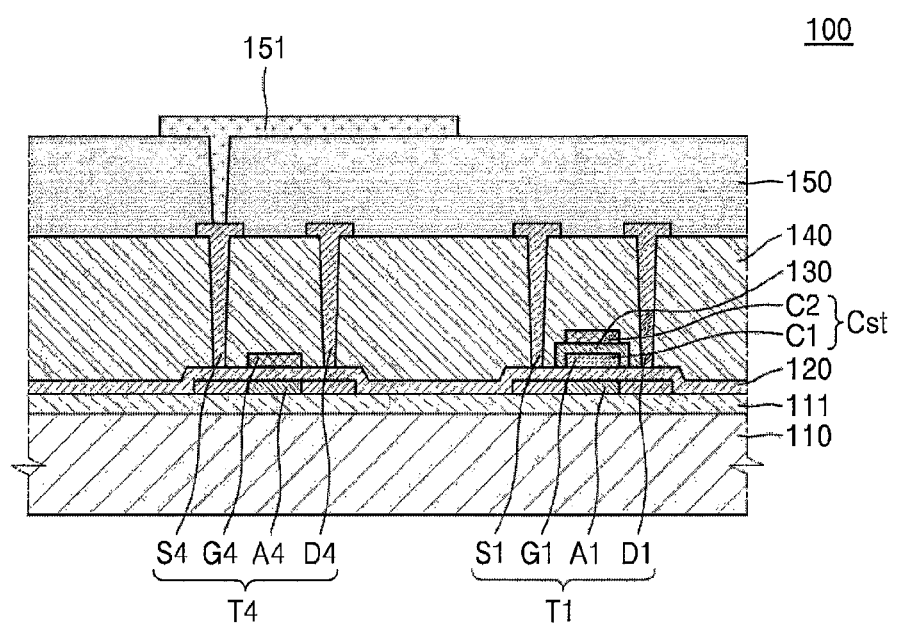
FIG. 3 is a cross-sectional view of a thin-film transistor (TFT) array substrate according to an exemplary embodiment.

FIG. 3 is a cross-sectional view of the TFT array substrate 100 according to an exemplary embodiment.

The TFT array substrate 100 is a substrate including at least one TFT. The TFT array substrate 100 can include a plurality of TFTs that are regularly arranged, a plurality of TFTs that are irregularly arranged, or only one TFT.

In some embodiments, the TFT array substrate 100 is applied to the OLED display 1000, but alternatively, the TFT array substrate 100 can be applied to any one of various display devices, such as a liquid crystal display, an electrophoresis display, and a plasma display.

Referring to FIG. 3, the TFT array substrate 100 includes the driving TFT T1, the storage capacitor Cst, switching TFTs, a capacitor insulating film 130, and an interlayer insulating film 140, which are formed on a substrate 110.

Herein, the switching TFTs are TFTs excluding the driving TFT T1 and that mainly perform switching operations. For example, the switching TFTs corresponds to the data transmission TFT T2, the compensation TFT T3, the first initialization TFT T4, the first emission control TFT T5, the second emission control TFT T6, and the second initialization TFT T7. In FIG. 3, the first initialization TFT T4 is shown as the switching TFT.

In the TFT array substrate 100 according to some embodiments, the driving gate electrode G1 is connected to the first electrode C1 of the storage capacitor Cst.

Also, the first initialization gate electrode G4 can be substantially simultaneously or concurrently formed with the second electrode C2.

In some embodiments, the first initialization gate electrode G4 is not simultaneously formed with the driving gate electrode G1, but is substantially simultaneously or concurrently formed with the second electrode C2 while forming the second electrode C2.

First, the first gate electrode G1 and the first electrode C1 are connected to each other to be integrally formed and the first initialization gate electrode G4 is substantially simultaneously or concurrently formed with the second electrode C2, and thus the capacitor insulating film 130 can be partially formed inside a region of the driving TFT T1, as shown in FIG. 3.

In some embodiments, the capacitor insulating film 130 is formed between the first and second electrodes C1 and C2 so as to insulate the second electrode C2 from the first electrode C1.

As described above, the capacitor insulating film 130 is not formed on an entire surface of the substrate 110, but can be partially formed only in the region of the driving TFT T1.

The capacitor insulating film 130 is formed on the driving gate electrode G1 after the driving gate electrode G1, but since the first initialization gate electrode G4 can be substantially simultaneously or concurrently formed with the second electrode C2, the first initialization gate electrode G4 is not formed while the capacitor insulating film 130 is formed.

The TFT array substrate 100 according to some embodiments can have high storage capacity of the storage capacitor Cst since the capacitor insulating film 130 formed between the first and second electrodes C1 and C2 is formed of a material having a dielectric constant.

Various wires and various TFTs can be formed for high performance and/or high integration of the TFT array substrate 100, and the various wires or the wire and the TFT can overlap each other. Accordingly, parasitic capacitance and/or signal interference can exist in the TFT array substrate 100.

In detail, when the capacitor insulating film 130 formed of a material having a high dielectric constant is formed on the entire surface of the substrate 110, signal interference can increase.

Accordingly, in some embodiments, since the capacitor insulating film 130 is partially formed in the region of the driving TFT T1 and is not formed in a region of the first initialization TFT T4, even if the capacitor insulating film 130 is formed of a material having a high dielectric constant, signal interference can be reduced.

For example, since the capacitor insulating film 130 having a high dielectric constant is not formed in a region where the first initialization TFT T4 is formed and only the interlayer insulating film 140 exists in the region where the first initialization TFT T4 is formed, resistance/capacitance (RC) delay can be reduced. Also, since the capacitor insulating film 130 having a high dielectric constant is formed only in a region where the driving TFT T1 is formed, the storage capacity of the storage capacitor Cst can increase.

The interlayer insulating film 140 can be formed on substantially the entire surface of the substrate 110 to cover the driving gate electrode G1 and the second electrode C2.

The interlayer insulating film 140 can be formed of a material having a low dielectric constant so as to reduce parasitic capacitance and/or signal interference.

In some embodiments, the dielectric constant of the interlayer insulating film 140 is lower than that of the capacitor insulating film 130.

In some embodiments, the interlayer insulating film 140 is formed of an organic material and the capacitor insulating film 130 is formed of an inorganic material.

Referring back to FIG. 3, a buffer layer 111 is formed on the substrate 110. The buffer layer 111 can operate as a barrier layer and/or a blocking layer to prevent impure ions from diffusing in the substrate 110, to prevent moisture or external air from penetrating into the substrate 110, and to substantially flatten a surface of the substrate 110. However, the buffer layer 111 is not a compulsory component, and can be excluded depending on user need.

A driving semiconductor layer or active layer A1 of the driving TFT T1 and a first initialization semiconductor layer A4 of the first initialization TFT T4 are formed on the buffer layer 111. The driving semiconductor layer A1 and the first initialization semiconductor layer A4 can be formed of polysilicon, and can each include a channel region on which an impurity is not doped, and a source region and a drain region on which impurities are doped and respectively formed on two sides of the channel region. Here, an impurity can differ based on a type of a TFT, and can be an N-type or P-type impurity.

A gate insulating film 120 is stacked on the entire surface of the substrate 110 to cover the driving semiconductor layer A1 and the first initialization semiconductor layer A4. The gate insulating film 120 can include a multilayer or a single layer of a film formed of an inorganic material, such as silicon oxide or silicon nitride. The gate insulating film 120 can insulate the driving semiconductor layer A1 and the first initialization semiconductor layer A4 from the driving gate electrode G1 and the first initialization gate electrode G4.

The driving gate electrode G1, the first electrode C1, and the first initialization gate electrode G4 are formed on the gate insulating film 120. The driving gate electrode G1 can be integrally formed with the first electrode C1.

In some embodiments, the first initialization gate electrode G4 is fowled on the same layer as the driving gate electrode G1, but is not formed during the same process as the driving gate electrode G1.

For example, as described above, in the TFT array substrate 100, the first initialization gate electrode G4 can be substantially simultaneously or concurrently formed during the same process as the second electrode C2, not the driving gate electrode G1 and the first electrode C1.

The driving gate electrode G1, the first initialization gate electrode G4, and the first electrode C1 can be formed of at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

According to an exemplary embodiment, the storage capacitor Cst can overlap the driving TFT T1. Since the driving gate electrode G1 and the first electrode C1 are integrally formed, the storage capacitor Cst and the driving TFT T1 overlap each other. Since the storage capacitor Cst overlaps the driving TFT T1, areas of the first and second electrodes C1 and C2 can be sufficiently obtained. Accordingly, the storage capacity of the storage capacitor Cst can be sufficiently obtained.

The capacitor insulating film 130 can be formed between the first and second electrodes C1 and C2 so as to insulate the second electrode C2 from the first electrode C1. For example, the capacitor insulating film 130 is partially formed only in the region of the driving TFT T1.

Since the capacitor insulating film 130 is partially formed in the region of the driving TFT T1, the capacitor insulating film 130 can be formed of a material having a high dielectric constant. Accordingly, the storage capacitor of the storage capacitor Cst can be sufficiently obtained without causing signal interference between wires.

The capacitor insulating film 130 can be formed of an inorganic material or an organic material. According to one or more exemplary embodiments, the capacitor insulating film 130 can be formed of an inorganic material having a high dielectric constant. For example, the capacitor insulating film 130 is formed of a metal oxide or a metal nitride, wherein examples of the inorganic material include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZrO_2$).

The capacitor insulating film 130 can be formed of a multilayer or a single layer of a film formed of an inorganic material, such as SiOx and/or SiNx. According to one or more exemplary embodiments, the capacitor insulating film 130 has a double structure of SiOx/SiNy or SiNx/SiOy.

The second electrode C2 can be formed on the capacitor insulating film 130 while being insulated from the first electrode C1. The second electrode C2 can be formed of at least one metal selected from among Al, Pt, Pd, Ag, Mg, Au, Ni, Nd, Ir, Cr, Li, Ca, Mo, Ti, W, and Cu.

While forming the second electrode C2, the first initialization gate electrode G4 of the first initialization TFT T4 can be substantially simultaneously or concurrently formed. Accordingly, since the capacitor insulating film 130 is not formed in the first initialization TFT T4, RC delay can be reduced.

The interlayer insulating film 140 is formed on substantially the entire surface of the substrate 110 to cover the second electrode C2 and the first initialization gate electrode G4.

The interlayer insulating film 140 can be formed of an inorganic material or an organic material. In some embodiments, interlayer insulating film 140 is formed of an organic material having a dielectric constant lower than the capacitor insulating film 130. For example, the interlayer insulating film 140 is formed of at least one material from among polyacrylate resin, epoxy resin, phenolic resin, polyamides resin, polyimide resin, unsaturated polyesters resin, polyphenylene ether resin, poly phenylenesulfide resin, and benzocyclobutene (BCB).

A via layer 150 is formed on substantially the entire surface of the substrate 110 to cover the driving source electrode S1 and the driving drain electrode D1, and the first initialization source electrode S4 and the first initialization drain electrode D4. A pixel electrode 151 can be formed on the via layer 150. The pixel electrode 151 is connected to the first initialization drain electrode D4 through a via hole VIA.

The via layer 150 can be formed of an insulating material. For example, the via layer 150 has a single layer or multi-layer structure formed of an inorganic material, an organic material, or an organic/inorganic compound, and is formed by using any one of various deposition methods. In some embodiments, a planarization layer (PL planarization layer) is formed of at least one material from among polyacrylate resin, epoxy resin, phenolic resin, polyamides resin, polyimide resin, unsaturated polyesters resin, poly phenylenethers resin, poly phenylenesulfides resin, and BCB.

FIGS. 4A through 4D are diagrams for describing a method of manufacturing the TFT array substrate 100, according to an exemplary embodiment.

Figure 4A:
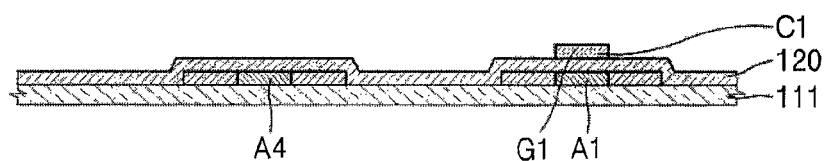
FIGS. 4A through 4D are diagrams for describing a method of manufacturing a TFT array substrate, according to an exemplary embodiment.

Referring to FIG. 4A, the driving semiconductor layer A1 and the first initialization semiconductor layer A4 are formed on the substrate 110, and the gate insulating film 120 is formed thereon.

The driving semiconductor layer A1 and the first initialization semiconductor layer A4 can be formed of a semiconductor including amorphous silicon or crystalline silicon, and can be deposited by using any one of various deposition methods. Here, crystalline silicon can be formed by crystallizing amorphous silicon. Examples of a method of crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. The driving semiconductor layer A1 and the first initialization semiconductor layer A4 can be patterned via a photolithography process.

The gate insulating film 120 insulates the driving semiconductor layer A1 and the first initialization semiconductor layer A4, and the driving gate electrode G1 and the first initialization gate electrode G4 that are to be formed thereon. The gate insulating film 120 is formed on the entire surface of the substrate 110 while covering the driving semiconductor layer A1 and the first initialization semiconductor layer A4. The gate insulating film 120 can be formed of an organic or inorganic insulating material. In some embodiments, the gate insulating film 120 is formed of SiNx, SiO2, HfO2, or $Al_2O_3$. The gate insulating film 120 can be formed by using any one of various deposition methods, such as sputtering, chemical vapor deposition (CVD), and plasma enhanced chemical vapor deposition (PECVD).

Then, the driving gate electrode G1 is formed on the gate insulating film 120 so as to at least partially overlap the driving semiconductor layer A1.

Figure 4B:
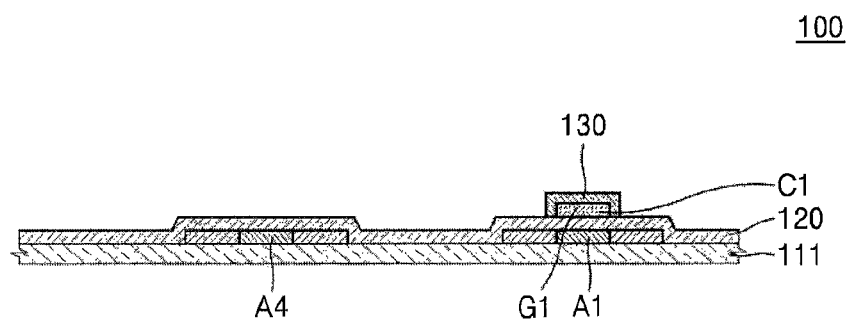

Then, referring to FIG. 4B, the capacitor insulating film 130 is partially formed on the driving gate electrode G1 to cover the driving gate electrode G1. The capacitor insulating film 130 can be formed of an organic material or an inorganic material. In some embodiments, the capacitor insulating film 130 is formed of an inorganic material having a high dielectric constant.

For example, as shown in FIG. 4B, the capacitor insulating film 130 is partially formed only in the region of the driving TFT T1. The capacitor insulating film 130 can be formed by using any one of various deposition methods, such as sputtering, CVD, and PECVD.

Figure 4C:
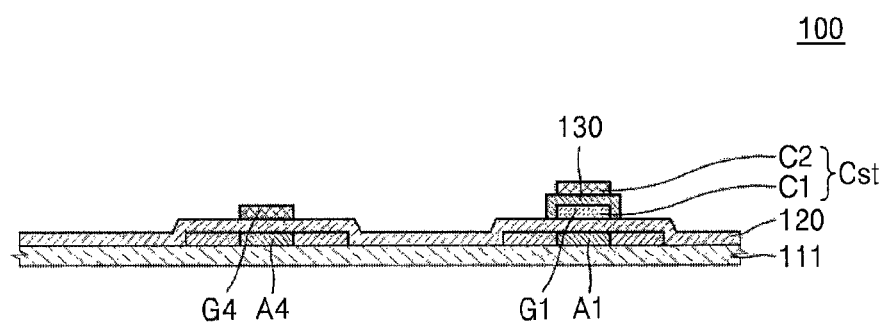

Then, referring to FIG. 4C, the second electrode C2 and the first initialization gate electrode G4 are substantially simultaneously or concurrently formed.

Figure 4D:
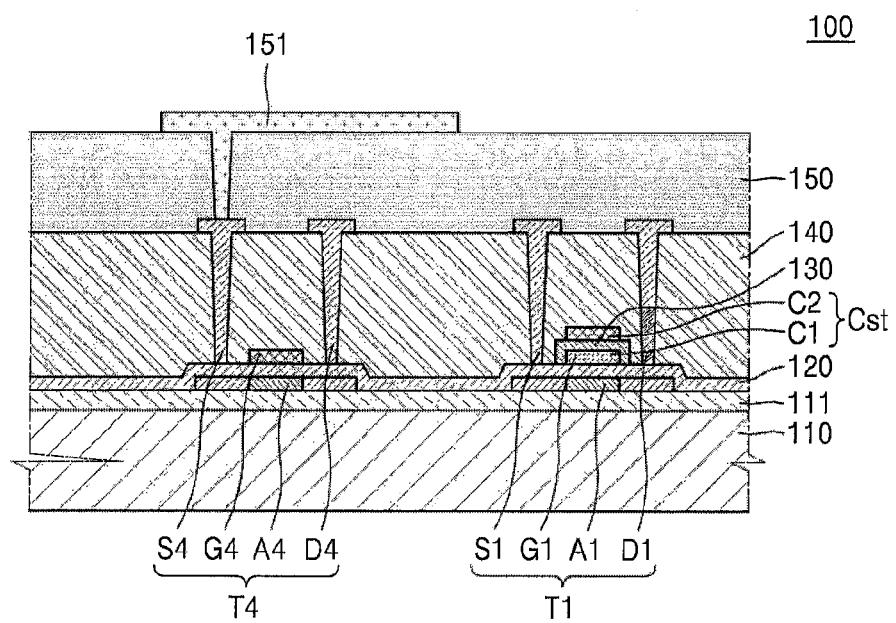

Then, as shown in FIG. 4D, the interlayer insulating film 140 is formed on substantially the entire surface of the substrate 110 to cover the second electrode C2 and the first initialization gate electrode G4.

The interlayer insulating film 140 can be formed of an inorganic material or an organic material. In some embodiments, the interlayer insulating film 140 is formed of an organic material having a dielectric constant lower than the capacitor insulating film 130. The interlayer insulating film 140 can be formed by using a spin coating process, a printing process, a sputtering process, a CVD process, an atomic layer deposition (ALD) process, a PECVD process, a high density plasma-CVD (HDP-CVD) process, or a vapor deposition process based on a material forming the interlayer insulating film 140.

Then, the via layer 150 is formed on the interlayer insulating film 140. Then, the via hole VIA is formed through the via layer 150. The pixel electrode 151 is formed on the via layer 150 and connected to the first initialization drain electrode D4 through the via hole VIA is formed.

Figure 5:
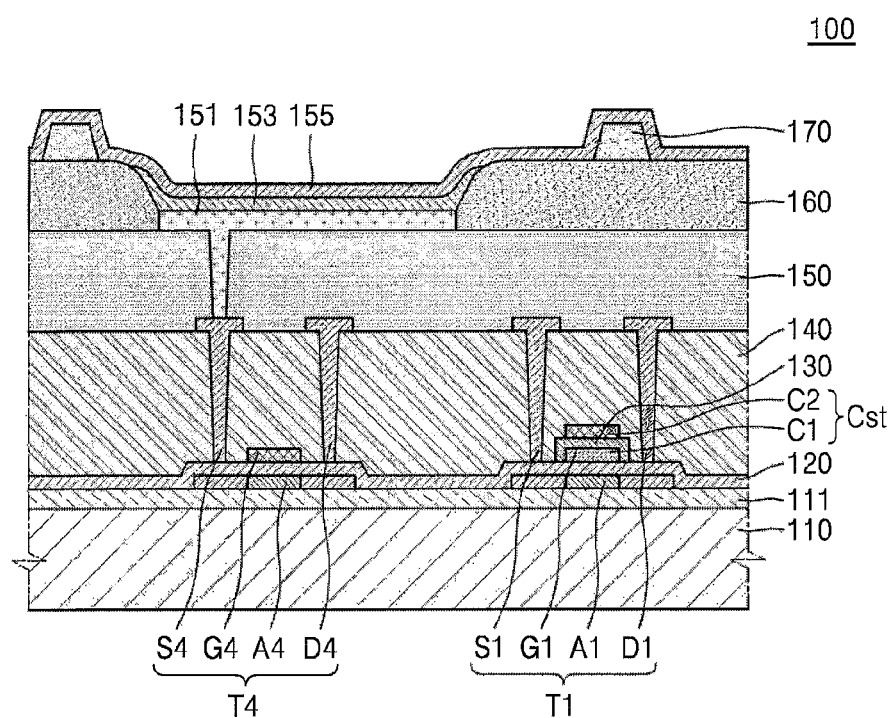
FIG. 5 is a cross-sectional view of an OLED display according to an exemplary embodiment.

FIG. 5 is a cross-sectional view of an OLED display according to an exemplary embodiment. Referring to FIG. 5, the OLED display includes the TFT array substrate 100. In FIGS. 3 and 5, like reference numerals denote like elements, and overlapping descriptions thereof are not provided again.

The OLED display includes the driving TFT T1, the storage capacitor Cst, the first initialization TFT T4, the capacitor insulating film 130, the interlayer insulating film 140, and the via layer 150, which are formed on the substrate 110.

The capacitor insulating film 130 can be formed between the first and second electrodes C1 and C2 of the storage capacitor Cst, and can be partially formed in the region of the driving TFT T1.

The OLED is formed in a display area of the OLED display. The OLED includes the pixel electrode 151, an intermediate layer 153 including an organic emission layer, and a counter electrode 155. Also, the OLED display can further include a pixel-defining film 160 and a spacer 170.

The pixel electrode 151 and/or the counter electrode 155 can be a transparent electrode or a reflective electrode. The transparent electrode can be formed of indium tin oxide (ITO), indium zinc oxide (IZO), zinc oxide (ZnO) or indium oxide (In2O3), and the reflective electrode can include a reflective film formed of Ag, Mg, Al, Pt, Pd, Au, Ni, Nd, Ir, Cr, or a compound thereof, and a transparent film formed of ITO, IZO, ZnO, or In2O3. In some embodiments, the pixel electrode 151 or the counter electrode 155 has a ITO/Ag/ITO structure.

The pixel electrode 151, the intermediate layer 153, and the counter electrode 155 form the OLED. Holes and electrons respectively injected from the pixel electrode 151 and the counter electrode 155 of the OLED can combine in the organic emission layer of the intermediate layer 153 to emit light.

The intermediate layer 153 can include the organic emission layer. Alternatively, the intermediate layer 153 can include the organic emission layer, and can further include at least one of a hole injection layer (HIL), a hole transport layer (HTL), an electron injection layer (ETL), and an electron injection layer (EIL). However, the current embodiment is not limited thereto, and the intermediate layer 153 can include the organic emission layer and further include other various functional layers.

The counter electrode 155 is formed on the intermediate layer 153. The counter electrode 155 forms an electric field with the pixel electrode 151 such that light is emitted from the intermediate layer 153. The pixel electrode 151 can have patterns according to pixels, and the counter electrode 155 can be formed such that a common voltage is applied to all pixels.

The pixel-defining film 160 can define a pixel region and a non-pixel region. The pixel-defining film 160 can include an opening exposing the pixel electrode 151 and can be formed to entirely cover the TFT array substrate 100.

In FIG. 5, only one OLED is shown, but a display panel can include a plurality of OLEDs. One pixel can be formed per OLED, and red, green, blue, or white colors can be realized per pixel.

The spacer 170 maintains an interval between the substrate 110 and a sealing substrate (not shown), and can be provided such that display characteristics are not deteriorated by an external impact.

The spacer 170 can be provided on the pixel-defining film 160. The spacer 170 can protrude in a direction from the pixel-defining film 160 to the sealing substrate.

In some embodiments, the spacer 170 is formed of the same material and through the same process as the pixel-defining film 160. For example, the pixel-defining film 160 and the spacer 170 are substantially simultaneously or concurrently formed by adjusting an exposure amount via an exposure process by using a halftone mask. However, an exemplary embodiment is not limited thereto, and the pixel-defining film 160 and the spacer 170 can be sequentially or separately formed, and can be independent structures formed by using different materials.

As described above, according to at least one of the disclosed embodiments, a switching gate electrode of a switching TFT is formed substantially simultaneously or concurrently with a second electrode of a storage capacitor after a driving gate electrode of a driving TFT is formed, and thus a capacitor insulating film is partially formed between a first electrode and the second electrode of the storage capacitor in a region of the driving TFT.

For example, since the capacitor insulating film is formed of a material having a high dielectric constant, signal interference does not occur, and thus storage capacity of the storage capacitor can be obtained without reduction caused by RC delay.

As described above, according to at least one of the disclosed embodiments, RC delay is reduced and at the same time, storage capacity of a storage capacitor is increased.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments. While the inventive technology has been described with reference to the figures, it will be understood by those of ordinary skill in the art that various changes in form and details can be made therein without departing from the spirit and scope as defined by the following claims.

What is claimed is:

1. A thin-film transistor (TFT) array substrate comprising:
    a driving TFT including a driving gate electrode;
    a switching TFT including a switching gate electrode and spaced apart from the driving TFT;
    a storage capacitor comprising a first electrode electrically connected to the driving gate electrode and a second electrode formed over and insulated from the first electrode;
    a capacitor insulating film formed between the first and second electrodes; and
    an interlayer insulating film covering i) at least part of the driving TFT, ii) at least part of the switching TFTs, and iii) the capacitor insulating film,
    wherein the switching gate electrode and the second electrode are formed of the same material.

2. The TFT array substrate of claim 1, further comprising a gate insulating film formed between the first electrode and a driving semiconductor layer of the driving TFT, wherein the capacitor insulating film is formed over the driving TFT, and wherein the capacitor insulating film and the gate insulating film surround the first electrode.

3. The TFT array substrate of claim 1, wherein the capacitor insulating film has a dielectric constant greater than that of the interlayer insulating film.

4. The TFT array substrate of claim 3, wherein the capacitor insulating film is formed of an inorganic material, and wherein the interlayer insulating film is formed of an organic material.

5. The TFT array substrate of claim 1, wherein the driving TFT and the storage capacitor at least partially overlap each other.

6. The TFT array substrate of claim 1, wherein the driving gate electrode and the first electrode are integrally formed over the same layer.

7. The TFT array substrate of claim 1, wherein the second electrode has a bottom side formed higher than a bottom side of the switching gate electrode.

8. The TFT array substrate of claim 1, wherein the width of the second electrode is substantially the same as the width of the driving gate electrode.

9. The TFT array substrate of claim 1, wherein the capacitor insulating film is formed only in a region of the driving TFT.

10. The TFT array substrate of claim 1, wherein the capacitor insulating film covers top and side portions of the driving electrode.

11. A thin-film transistor (TFT) array substrate comprising:
    a driving TFT including a driving gate electrode;
    a switching TFT spaced apart from the driving TFT;
    a storage capacitor comprising a first electrode electrically connected to the driving gate electrode and a second electrode formed over and insulated from the first electrode;
    a capacitor insulating film formed between the first and second electrodes and formed only in a region of the driving TFT; and
    an interlayer insulating film covering i) at least part of the driving TFT, ii) at least part of the switching TFTs, and iii) the capacitor insulating film.

12. The TFT array substrate of claim 11, wherein the switching TFT includes a switching gate electrode formed of the same material as the second electrode.

13. The TFT array substrate of claim 11, wherein the driving TFT and the storage capacitor at least partially overlap each other.

14. The TFT array substrate of claim 11, further comprising a gate insulating film formed between the first electrode and a driving semiconductor layer of the driving TFT, wherein the capacitor insulating film and the gate insulating film surround the first electrode.

15. A thin-film transistor (TFT) array substrate comprising:
   a driving TFT;
   a switching TFT including a switching gate electrode and spaced apart from the driving TFT;
   a storage capacitor comprising i) a first electrode configured to function as a gate electrode of the driving TFT and ii) a second electrode formed over and insulated from the first electrode;
   a capacitor insulating film formed between the first and second electrodes; and
   an interlayer insulating film covering i) at least part of the driving TFT, ii) at least part of the switching TFTs, and iii) the capacitor insulating film,
   wherein the capacitor insulating film is formed only in a region of the driving TFT, and
   wherein the second electrode is electrically connected to the switching gate electrode.

16. The TFT array substrate of claim 15, wherein the capacitor insulating film covers top and side portions of the driving electrode.

17. An organic light-emitting diode (OLED) display comprising:
   a display area comprising a plurality of pixels and
   a non-display area surrounding the display area, wherein each of the pixels comprises:
      a driving thin-film transistor (TFT) including a driving gate electrode;
      a switching TFT spaced apart from the driving TFT;
      a storage capacitor comprising a first electrode electrically connected to the driving gate electrode and a second electrode formed over and insulated from the first electrode;
      a capacitor insulating film formed between the first and second electrodes and formed only in a region of the driving TFT; and
      an interlayer insulating film covering i) at least part of the driving TFT, ii) at least part of the switching TFTs, and iii) the capacitor insulating film.

18. The OLED display of claim 17, wherein the second electrode has a bottom side formed higher than a bottom side of the switching gate electrode.

19. The OLED display of claim 17, wherein the capacitor insulating film is formed only in a region of the driving TFT.

20. The OLED display of claim 17, wherein the capacitor insulating film covers top and side portions of the driving electrode.

* * * * *